US012212352B2

(12) United States Patent
Beidas

(10) Patent No.: US 12,212,352 B2
(45) Date of Patent: Jan. 28, 2025

(54) MULTIBAND DIGITAL PREDISTORTION FOR BROADBAND COMMUNICATIONS

(71) Applicant: Hughes Network Systems, LLC, Germantown, MD (US)

(72) Inventor: Bassel F. Beidas, Alexandria, VA (US)

(73) Assignee: Hughes Network Systems, LLC, Germantown, MD (US)

( * ) Notice: Subject to any disclaimer, the term of this patent is extended or adjusted under 35 U.S.C. 154(b) by 20 days.

(21) Appl. No.: 18/340,604

(22) Filed: Jun. 23, 2023

(65) Prior Publication Data

US 2024/0429947 A1    Dec. 26, 2024

(51) Int. Cl.
*H04B 1/04*    (2006.01)

(52) U.S. Cl.
CPC ... *H04B 1/0475* (2013.01); *H04B 2001/0425* (2013.01)

(58) Field of Classification Search
CPC ............. H04B 1/0475; H04B 2001/0425
See application file for complete search history.

(56) References Cited

U.S. PATENT DOCUMENTS

| 9,748,983 | B2 * | 8/2017 | Tanio | H03F 3/3022 |
| 2005/0168283 | A1 * | 8/2005 | Suzuki | H03F 1/3252 330/149 |
| 2013/0094612 | A1 * | 4/2013 | Kim | H04L 27/2626 375/297 |
| 2014/0348263 | A1 * | 11/2014 | Rollins | H03F 3/24 375/296 |
| 2015/0236731 | A1 | 8/2015 | Ghannouchi et al. | |
| 2023/0179467 | A1 | 6/2023 | Yang et al. | |

FOREIGN PATENT DOCUMENTS

WO    2022237395 A1    11/2022

OTHER PUBLICATIONS

Abe et al., "Band-Split Parallel Signal Processing DPD for Non-linear Compensation of Broadband RF Signal," 2018 15th International Symposium on Wireless Communication Systems (ISWCS), 5 pages.
Liu et al., "Multiband Linearization Technique for Broadband Signal With Multiple Closely Spaced Bands," IEEE Transactions on Microwave Theory and Techniques, vol. 67, No. 3, Mar. 2019, 15 pages.

* cited by examiner

*Primary Examiner* — Vineeta S Panwalkar
(74) *Attorney, Agent, or Firm* — Kilpatrick Townsend & Stockton LLP

(57) ABSTRACT

Techniques are described for implementing multiband digital predistortion in a broadband transmitter in a manner that provides effective compensation of non-linear distortion arising from integration of a high-power amplifier (HPA). Embodiments segment the signal spectrum of a transmit signal into multiple sub-band signals and apply non-linear distortion compensation separately and concurrently for each sub-band signal. The resulting multi-band digital predistortion (mDPD) compensates both for in-band distortion and for distortions from non-linear interactions between the frequency sub-bands. The disclosed mDPD can provide enhanced performance features, such as handling of memory effects, reduced sampling rate requirements for DPD components, and minimizing detrimental spectral regrowth at the HPA output.

20 Claims, 11 Drawing Sheets

400a

|  | Sub-Band 1 | Sub-Band 2 |
|---|---|---|
| 3rd Order | [1 1 1] | [1 2 1] |
|  | [1 2 2] | [2 2 2] |
| 5th Order | [1 1 1 1 1] | [1 1 2 1 1] |
|  | [1 1 2 1 2] | [1 2 2 1 2] |
|  | [1 2 2 2 2] | [2 2 2 2 2] |

|  | Sub-Band 1 | Sub-Band 2 | Sub-Band 3 | Sub-Band 4 |
|---|---|---|---|---|
| 3rd Order | [1 1 1] | [1 2 1] | [1 3 1] | [1 4 1] |
|  | [1 2 2] | [1 3 2] | [2 2 1] | [2 4 2] |
|  | [1 3 3] | [2 2 2] | [2 3 2] | [3 4 3] |
|  | [1 4 4] | [2 3 3] | [3 3 3] | [4 4 4] |
|  | [2 2 3] | [2 4 4] | [3 4 4] |  |
| 5th Order | [1 1 1 1 1] | [1 1 2 1 1] | [1 1 3 1 1] | [1 1 4 1 1] |
|  | [1 1 2 1 2] | [1 1 3 1 2] | [1 2 2 1 1] | [1 2 4 1 2] |
|  | [1 1 3 1 3] | [1 2 2 1 2] | [1 2 3 1 2] | [1 3 4 1 3] |
|  | [1 1 3 2 2] | [1 2 3 1 3] | [1 3 3 1 3] | [1 3 4 2 2] |
|  | [1 1 4 1 4] | [1 2 3 2 2] | [1 3 3 2 2] | [1 4 4 1 4] |
|  | [1 2 2 1 3] | [1 2 4 1 4] | [1 3 4 1 4] | [2 2 4 1 3] |
|  | [1 2 2 2 2] | [1 3 3 2 3] | [2 2 2 1 2] | [2 2 4 2 2] |
|  | [1 2 3 2 3] | [1 3 4 2 4] | [2 2 3 1 3] | [2 3 4 2 3] |
|  | [1 2 4 2 4] | [2 2 2 1 3] | [2 2 3 2 2] | [2 4 4 2 4] |
|  | [1 3 3 3 3] | [2 2 2 2 2] | [2 2 4 1 4] | [3 3 4 3 3] |
|  | [1 3 4 3 4] | [2 2 3 2 3] | [2 3 3 2 3] | [3 4 4 3 4] |
|  | [1 4 4 4 4] | [2 2 4 2 4] | [2 3 4 2 4] | [4 4 4 4 4] |
|  | [2 2 2 2 3] | [2 3 3 3 3] | [3 3 3 3 3] |  |
|  | [2 2 3 3 3] | [2 3 4 3 4] | [3 3 4 3 4] |  |
|  | [2 2 4 3 4] | [2 4 4 4 4] | [3 4 4 4 4] |  |

FIG. 4B

MULTIBAND DIGITAL PREDISTORTION FOR BROADBAND COMMUNICATIONS

BACKGROUND

Radiofrequency (RF) transmitters, such as for satellite communications, typically include high-power amplifier (HPA). Integration of the HPA tends to add non-linear distortion to the signal it is amplifying, particularly when driven near saturation to achieve power efficiency. Such non-linear distortion primarily manifests as two effects: as spectral spreading or regrowth causing spillage into adjacent frequency bands, potentially violating strict spectral limits set by regulatory commissions; and as in-band distortion causing constellation warping and clustering as experienced at the receive filter output. Both effects can be detrimental and can severely degrade system performance unless adequate countermeasures are taken.

Some conventional RF transmitters include digital pre-distortion (DPD) prior to the HPA to effectively pre-compensate for the non-linear distortion that will be introduced by the HPA. Such conventional DPD tend to employ single-band DPD applied on the full signal spectrum which can require sampling rates of four to eight times the full signal bandwidth. In context of broadband signaling, which can provide very high throughput requiring correspondingly very high sampling rates, such conventional DPD can become excessively costly and/or difficult to support. For example, such approaches can be limited by practical limitations of digital-to-analog converters (DACs), analog-to-digital converters (ADCs), and/or other components. To the extent that state-of-the-art approaches implement DPD in very high throughput contexts, they typically neglect non-linear interactions across bands. Such approaches result in inefficiencies, as the linearization performance can be severely limited by non-linear cross-product terms of the combined frequency bands.

SUMMARY

Systems and methods are described herein for implementing multiband digital predistortion in a broadband transmitter. Embodiments provide effective compensation of non-linear distortion primarily arising from integration of a high-power amplifier (HPA) when driven near saturation to achieve power efficiency. Embodiments segment the signal spectrum of a transmit signal into multiple frequency sub-bands. For each sub-band, embodiments apply non-linear distortion compensation, thereby implementing multi-band digital predistortion (mDPD). The disclosed mDPD compensates for non-linear interactions within each frequency sub-band and between the frequency sub-bands, providing for enhancing performance and for handling memory effects of a designer-specified depth and nonlinearity of a designer-determined order. Due to its multi-band nature, the disclosed mDPD can operate at a significantly reduced sampling rate. This can relieve design requirements for digital-to-analog converters (DACs), analog-to-digital converters (ADCs), and/or other components, and thereby increasing practicality and lowering cost in broadband implementation contexts. Further, the disclosed mDPD can minimize detrimental spectral regrowth at the HPA output by operating on multiple samples per signaling symbol.

In one set of embodiments, a transmitter is provided. The transmitter includes: a high-power amplifier (HPA); a segmenter to segment a wide-band (WB) input signal into N sub-band (SB) input signals, wherein N is a positive integer greater than 1; a multi-band digital pre-distortion (mDPD) processor coupled with the segmenter to generate N pre-distorted SB signals from the N SB input signals by pre-compensating each SB input signal of the N SB input signals both for a respective estimated in-band distortion and for a respective estimated cross-band distortion, each respective estimated in-band distortion and each respective estimated cross-band distortion derived from a model of non-linear characteristics of the HPA; and a combiner coupled with the mDPD processor to generate a pre-distorted output signal based on combining the N pre-distorted SB signals, wherein the HPA is coupled with the combiner to generate an amplified uplink signal from the pre-distorted output signal. In some such embodiments, the transmitter further includes: a distortion modeler coupled in feedback with the HPA to generate and/or update the model of the non-linear characteristics of the HPA based on inverse amplifier modeling of the HPA using at least the amplified uplink signal.

In another set of embodiments, a method is provided for multi-band pre-distortion (mDPD) in a transmitter. The method includes: receiving a wide-band (WB) input signal; segmenting the WB input signal into N sub-band (SB) input signals, wherein N is a positive integer greater than 1; generating N pre-distorted SB signals from the N SB input signals by pre-compensating each SB input signal of the N SB input signals both for a respective estimated in-band distortion and for a respective estimated cross-band distortion, each respective estimated in-band distortion and each respective estimated cross-band distortion derived from a model of non-linear characteristics of a high-power amplifier (HPA); combining the N pre-distorted SB signals to generate a pre-distorted output signal; and generating an amplified uplink signal from the pre-distorted output signal by the HPA. In some such embodiments, the method further includes: receiving a mode select signal; responsive to the mode select signal indicating to switch to an offline mode, coupling a distortion modeler in feedback with the HPA to generate and/or update the model of the non-linear characteristics of the HPA based on inverse amplifier modeling of the HPA using at least the amplified uplink signal; and responsive to the mode select signal indicating to switch to an online mode, de-coupling the distortion modeler from the HPA.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIGS. 4A and 4B show examples of sub-band combinations for the third-order and fifth-order significant non-linear distortion illustrative dual-band and quad-band cases of multi-band digital pre-distortion (mDPD), respectively.

DETAILED DESCRIPTION

Radiofrequency RF transmitters, such as for satellite communications, typically include high-power amplifier (HPA). Integration of the HPA tends to add non-linear distortion to the signal it is amplifying, particularly when driven near saturation to achieve power efficiency. Some conventional RF transmitters seek to pre-distort the signal prior to the HPA to effectively pre-compensate for the non-linear distortion that will be introduced by the HPA. Such conventional approaches tend either to employ single-band pre-distortion (applied on the full signal spectrum) or to ignore sources of distortion, such as cross-band interactions. These conventional approaches are limited in several ways, such as by requiring sampling rates that are too high to be practical for many broadband applications, and/or by producing appreciable inefficiencies.

Embodiments described herein provide a novel type of pre-distortion, referred to herein as "multiband digital pre-distortion," or mDPD. Embodiments provide effective compensation of non-linear distortion by segmenting the signal spectrum of a transmit signal according to multiple frequency sub-bands and applying non-linear distortion compensation separately and concurrently for each sub-band. For each sub-band, the non-linear distortion compensation compensates both for in-band distortion and for cross-band distortions produced by the HPA in that sub-band. The disclosed mDPD provides several features, including enhanced handling of memory effects of a designer-specified depth and nonlinearity of a designer-determined order, operation at an appreciably reduced sampling rate as compared to conventional single-band pre-distortion, and minimized detrimental spectral regrowth at the HPA output.

Figure 1:
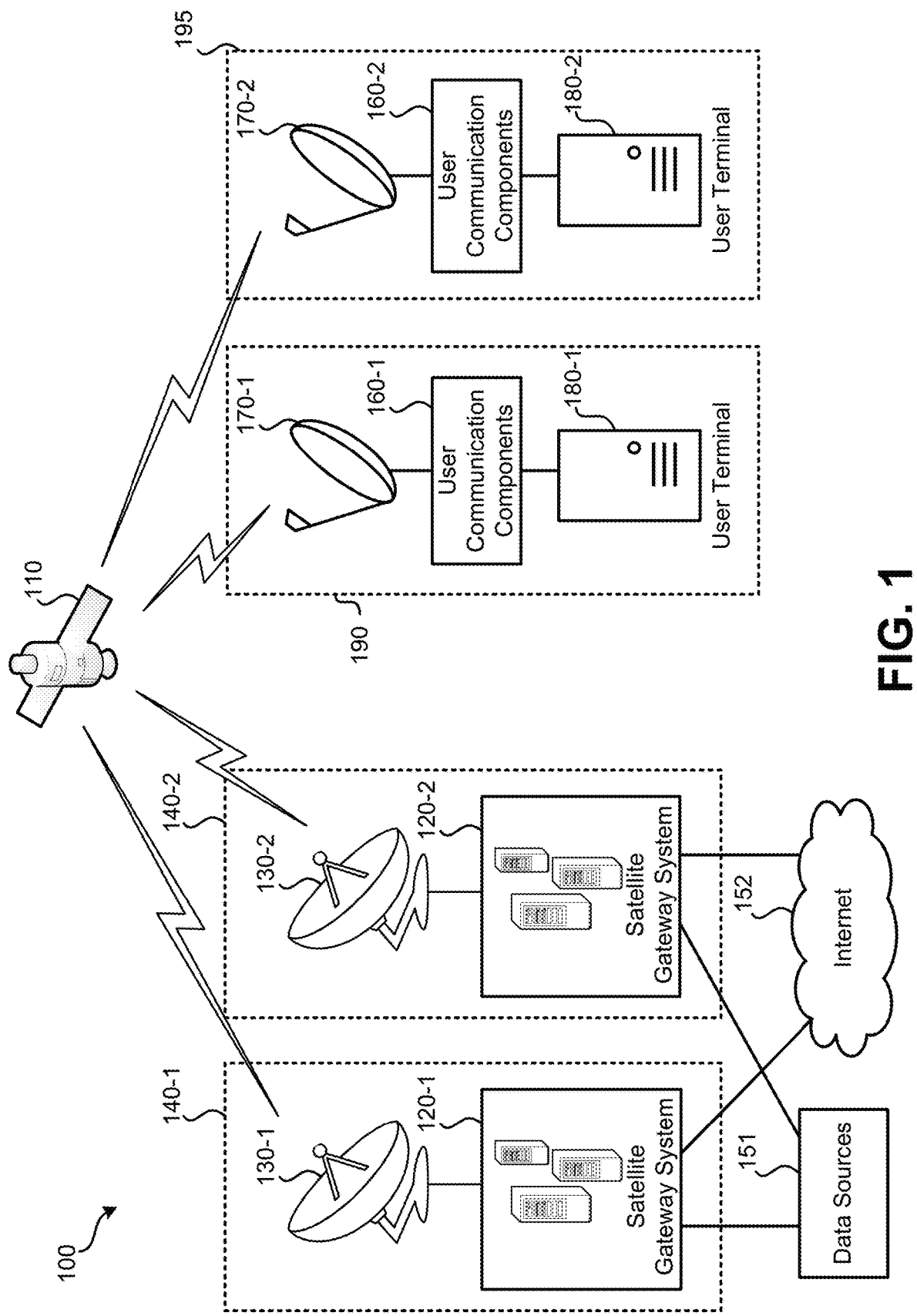
FIG. 1 illustrates an embodiment of a bidirectional satellite communication system as a context for embodiments described herein.

Further detail regarding these concepts is provided in relation to the figures. FIG. 1 illustrates an embodiment of a bidirectional satellite communication system 100 as a context for embodiments described herein. Bidirectional satellite communication system 100 may include: relay satellite 110; satellite gateway systems 120; bidirectional satellite communication links 130; data sources 151; user communication components 160; satellite antennas 170; and user terminals 180. Relay satellite 110 may be a bidirectional communication satellite that relays communications between satellite gateway systems 120 and user communication components 160. Therefore, via relay satellite 110, data may be transmitted from satellite gateway systems 120 for receipt by user communication components 160; and data may be transmitted from user communication components 160 for receipt by satellite gateway systems 120. Embodiments described herein focus on the transmit side of such communications.

In some embodiments, system 100 may be used to provide user communication components 160 with Internet access, and/or access to any other suitable public and/or private networks. Additionally or alternatively, system 100 may be used to provide user communication components 160 with access to one or more data source 151, which may be a private network, data source, or server system. In some architectures, satellite gateway systems 120 are in communication with backhaul infrastructure, terrestrial networks, and/or other communications infrastructure.

Relay satellite 110 may use different frequencies for communication with satellite gateway systems 120 than for communication with user communication components 160. Further, different frequencies may be used for uplink communications than for downlink communications. For example, different frequency bands, sub-bands, etc. can be used for some or all of forward uplink communications (satellite gateway system 120 to relay satellite 110), forward downlink communications (relay satellite 110 to user communication components 160), return uplink communications (user communication components 160 to relay satellite 110), and return downlink communications (relay satellite 110 to satellite gateway system 120).

Each satellite gateway system 120 is located at a respective geographic location 140. For example, satellite gateway system 120-1 communicates with relay satellite 110 using bidirectional satellite communication link 130-1, which can include one or more high-gain antennas that allow high data transmission rates between satellite gateway system 120-1 and relay satellite 110. Satellite gateway system 120-1 may receive data from and transmit data to many instances of user equipment, such as user communication components 160. Satellite gateway system 120-1 may encode data into a proper format for relaying by relay satellite 110. Similarly, satellite gateway system 120-1 may decode data received from various instances of user communication components 160 received via relay satellite 110.

Satellite gateway system 120-1 may serve as an intermediary between the satellite communication system and other data sources, such as data sources 151 and Internet 152. Satellite gateway system 121 may receive requests from user communication components 160 via relay satellite 110 for data accessible using Internet 152. Satellite gateway system 120-1 may retrieve such data from Internet 152 and transmit the retrieved data to the requesting instance of user equipment via relay satellite 110. Additionally or alternatively, satellite gateway system 120-1 may receive requests from user communication components 160 via relay satellite 110 for data accessible in data sources 151. Satellite gateway system 120-1 may retrieve such data from data sources 151 and transmit the retrieved data to the requesting instance of user equipment via relay satellite 110.

Satellite gateway system 120-2 may function similarly to satellite gateway system 120-1, but may be located in a different physical location. While satellite gateway system 120-1 is located at geographic location 140-1, satellite gateway system 120-2 is located at geographic location 140-2. Co-located with satellite gateway system 120-2 may be bidirectional satellite communication link 130-2. Satellite gateway system 120-2 and bidirectional satellite communication link 130-2 may service a first group of user equipment while satellite gateway system 120-1 and bidirectional satellite communication link 130-1 may service another set of user equipment. Satellite gateway system 120-2 and bidirectional satellite communication link 130-2 may function similarly to satellite gateway system 120-1 and bidirectional satellite communication link 130-1 respectively.

Embodiments can use various techniques to mitigate interference between gateway systems 120. Some embodiments mitigate interference by geographic diversity. For example, geographic locations 140-1 and 140-2 may be separated by a significant enough distance such that the same frequencies can be used for uplink and downlink communications between bidirectional satellite communication links 130 and relay satellite 110 without a significant amount of interference occurring. Other embodiments use frequency diversity (e.g., multiple colors, such as different frequency bands or sub-bands) between adjacent gateway systems 120. Other embodiments use temporal diversity (e.g., different communication timing) between adjacent gateway systems 120.

While two instances of satellite gateway systems 120 and bidirectional satellite communication links 130 are illustrated as part of system 100, it should be understood that in some embodiments only a single satellite gateway system and a single bidirectional satellite communication link system are present or a greater number of satellite gateway systems 120 and bidirectional satellite communication links 130 are present. For example, for a satellite-based Internet service provider, four to eight (or significantly more) satellite gateway systems 120 and associated bidirectional satellite communication links 130 may be scattered geographically throughout a large region, such as North America.

User communication components 160, along with user terminals 180 and satellite antennas 170 (which can collectively be referred to as "user equipment") may be located in a fixed geographic location or may be mobile. For example, user communication components 160-1, satellite antenna 170-1, and user terminal 180-1 may be located at a residence of a subscriber that has a service contract with the operator of satellite gateway systems 120. The term "user" is intended only to distinguish from the gateway side of the network 100. For example, user terminal 180 can be associated with an individual subscriber to satellite communication services, with a corporate or other entity user, with a robotic user, with an employee of the satellite communication services provider, etc.

User communication components 160-1, satellite antenna 170-1, and user terminal 180-1 may be located at a fixed location 190. Fixed location 190 may be a residence, a building, an office, a worksite, or any other fixed location at which access to Internet 152 and/or private data source 151 is desired. User communication components 160-2, satellite antenna 170-2, and user terminal 180-2 may be mobile. For instance, such equipment may be present in an airplane, ship, vehicle, or temporary installation. Such equipment may be present at geographic location 195; however, geographic location 195 may change frequently or constantly, such as if the airplane, ship, or vehicle is in motion.

Satellite antenna 170-1 may be a small dish antenna, approximately 50 to 100 centimeters in diameter. Satellite antenna 170-1 may be mounted in a location that is pointed towards relay satellite 110, which may be in a geosynchronous orbit around the earth (i.e., the relay satellite 110 is a geosynchronous, or GEO, satellite). As such, the direction in which satellite antenna 170-1 is to be pointed stays constant. In some embodiments, low Earth orbit (LEO) and medium Earth orbit (MEO) satellites may be used in place of a geosynchronous satellite in the system. In some embodiments, relay satellite 110 is a high-throughput multi-beam satellite that communicates with user terminals using multiple (e.g., hundreds of) spot beams. In case of a multi-beam GEO satellite, for example, each of the multiple spot beams illuminates a respective coverage area. A fixed-location user terminal 180 can communicate with the relay satellite 110 generally via a particular one of the spot beams, unless there is some reason to reassign the user terminal 180 (e.g., in case of a gateway system 120 outage). Communications with mobile user terminals 180 can be handed off between spot beams as the mobile user terminal 180 moves through different coverage areas. In the case of non-GEO (e.g., MEO or LEO) relay satellites 110, spot beam coverage areas typically trace a path across the surface of the Earth with changes in the satellite's position relative to the Earth.

User communication component 160-1 refers to the hardware necessary to translate signals received from relay satellite 110 via satellite antenna 170-1 into a format which user terminal 180-1 can decode. Similarly, user communication components 160-1 may encode data received from user terminal 180-1 into a format for transmission via satellite antenna 170-1 to relay satellite 110. User communication components 160-1 may include a satellite communication modem. This modem may be connected with or may have incorporated a wired or wireless router to allow communication with one or more user terminals. In system 100, a single user terminal, user terminal 180-1, is shown in communication with user communication components 160-1. It should be understood that, in other embodiments, multiple user terminals may be in communication with user communication components 160-1. User terminal 180-1 may be various forms of computerized devices, such as: a desktop computer; a laptop computer; a smart phone; a gaming system or device; a tablet computer; a music player; a smart home device; a smart sensor unit; Voice over IP (VOIP) device, or some other form of computerized device that can access Internet 152 and/or private data source 151. Since user communication components 160 and a satellite antenna 170 can continue communicating with a satellite gateway system even if a user terminal 180 is not currently communicating with user communication components 160-1, it should be understood that some instances of user equipment may not include a user terminal 180.

Despite being in motion or in a temporary location, user communication components 160-2, satellite antenna 170-2, and user terminal 180-2 may function similarly to user communication components 160-1, satellite antenna 170-1, and user terminal 180-1. In some instances, satellite antenna 170-2 may either physically or electronically point its antenna beam pattern at relay satellite 110. For instance, as a flight path of an airplane changes, satellite antenna 170-2 may need to be aimed in order to receive data from and transmit data to relay satellite 110. As discussed in relation to user terminal 180-1, only a single user terminal, user terminal 180-2, is illustrated as in communication with user communication components 160-2 as part of system 100. It should be understood that in other embodiments, multiple user terminals may be in communication with user communication components 160-2. For example, if such equipment is located on an airplane, many passengers may have computerized devices, such as laptop computers and smart phones, which are communicating with user communication components 160-2 for access to Internet 152 and/or private data source 151. As detailed in relation user terminal 180-1, user terminal 180-2 may be various forms of computerized devices, such as those previously listed.

While FIG. 1 illustrates only two instances of user communication components 160, two instances of satellite antennas 170, and two instances of user terminals 180, system 100 may involve any suitable number (e.g., hundreds or thousands) of instances of satellite antennas, user equipment, and user terminals distributed across various geographic locations. Some number of these instances may be in relatively fixed locations, while others of these instances may have periodically or constantly changing locations (e.g., mobile terminals, or aero terminals for providing Internet service in aircraft, or the like). Further, while only a single relay satellite 110 is shown, some architectures include multiple satellites, such as cooperating satellites in a constellation, multiple satellites with overlapping coverage areas, etc.

Communications in such a system 100 can be generally considered as having a transmit side implemented by a transmitter and a receive side implemented by a receiver (e.g., ignoring the satellite). For example, in a forward-link communication, the transmitter is in a satellite gateway system 120 and the receiver is in a user terminal 180; in a return-link communication, the transmitter is in a user terminal 180 and the receiver is in a satellite gateway system 120. As described herein, the transmitter typically includes a high-power amplifier stage that may be run at close to saturation, which can cause non-linear distortion. The transmitter may include a pre-distortion stage prior to the high-power amplifier to effectively pre-compensate for that non-linear distortion.

Figure 2:
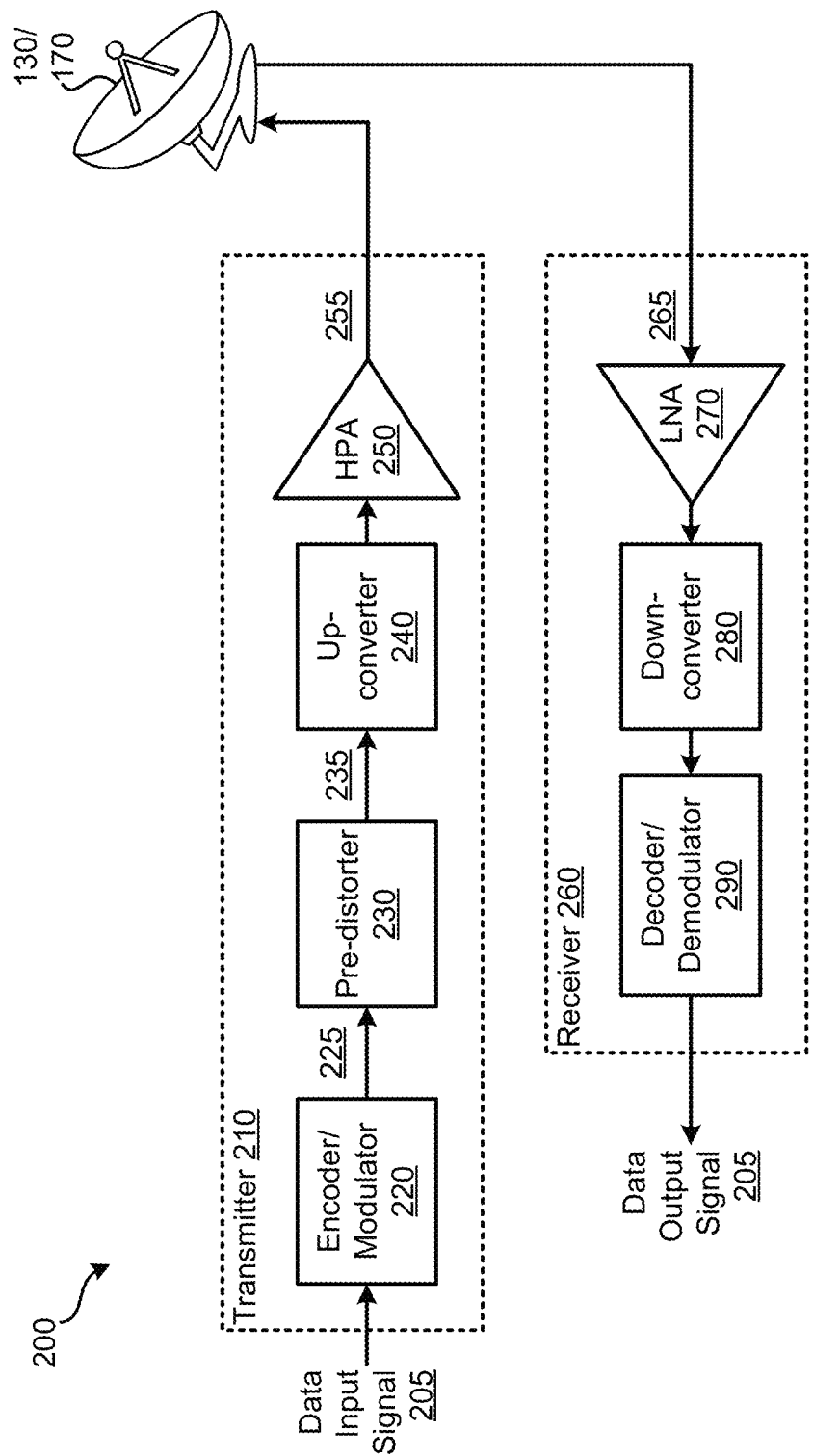
FIG. 2 shows a simplified block diagram of a satellite terminal having a transmitter and a receiver.

FIG. 2 shows a simplified block diagram of a satellite terminal 200 having a transmitter 210 and a receiver 260. For context, the transmitter 210 and receiver 260 are illustrated as coupled with a satellite antenna (e.g., labeled as antenna 130 in the case that the transmitter 210 and receiver 260 are part of a satellite gateway system 120, or alternatively labeled as antenna 170 in the case that the transmitter 210 and receiver 260 are part of a user terminal 180). As illustrated, the transmitter 210 includes an encoder/modulator 220, a pre-distorter 230, an upconverter 240, and a high-power amplifier (HPA) 250. The receiver 260 includes a low-noise amplifier (LNA) 270, a down-converter 280, and a decoder/demodulator 290.

The transmitter 210 receives a data input signal 205. The data input signal 205 represents the data signal to be transmitted, such as a voice, data, video, or other data signal. The data input signal 205 can be received as an analog or digital signal. At the encoder/modulator 220, the data input signal 205 is converted into a form suitable for transmission over the satellite link. For example, the encoder/modulator 220 can apply source coding to compress the data input signal 205, apply channel coding to the data input signal 205 to add error correction codes, interleave the data input signal 205 to rearrange the data for better error resilience, and modulate the data input signal 205 to convert the data into a format suitable for transmission over the satellite. Skipping the pre-distorter 230 temporarily, the upconverter 240 increases the frequency of the modulated and encoded signal to a desired satellite frequency band. The upconverter 240 can typically include a local oscillator that generates a carrier frequency and a mixer that combines the modulated and encoded signal with the carrier frequency. For example, the data input signal 205 can be received in a baseband frequency range, and the upconverter 240 can increase the frequency to Ka band, or any other suitable satellite frequency range.

The upconverted signal can be amplified by the HPA 250 to a signal level that is suitable for transmission over the satellite uplink. For example, the HPA 250 boosts the signal power to overcome losses in the transmission path and provides sufficient power for satellite reception at a destination. As described herein, it is often desirable to run the HPA 250 at close to saturation, which refers to the point at which the HPA 250 can no longer amplify the input signal without distortion and at which further increases in input power result in limited or no additional output power gain. Despite the introduction of such distortion, running the HPA 250 at close to saturation can provide several benefits in certain contexts. One benefit is that operating the HPA 250 near saturation can yield higher power efficiency, resulting in delivery of greater output power levels with lower energy consumption. Another benefit is that operating the HPA 250 near saturation can facilitate running the transmitter 210 at a maximum output power level while staying within constraints of the equipment and system design of the transmitter 210. Nonetheless, operating the HPA 250 near saturation adds non-linear distortion to the transmitted signal, which can degrade performance of the satellite link if not carefully managed. Such non-linear distortions primarily manifest as two effects. The first effect is spectral spreading or regrowth causing spillage into adjacent frequency bands and possibly violating strict spectral limits (e.g., as set by regulatory commissions). The second effect is in-band distortion causing constellation warping and clustering as experienced at the receive filter output. Both effects can be detrimental and can severely degrade system performance unless adequate countermeasures are taken.

An effective countermeasure for managing the non-linear distortion from the HPA 250 is to add the pre-distorter 230 prior to the HPA 250 (e.g., typically prior also to the upconverter 240). In general, the pre-distorter 230 seeks to pre-compensate for the non-linear distortion that will be introduced downstream by the HPA 250. For example, if the non-linear distortion of the HPA 250 can be modeled as a transfer function, the pre-distorter 230 ideally applies the inverse of that transfer function to the signal, so that the output of the HPA 250 is a linear signal free of the non-linear distortion. Pre-distortion performed in the digital domain is referred to as digital pre-distortion (DPD). DPD typically involves advanced signal processing algorithms. Conventional DPD approaches tend to be single-band approaches, which apply DPD on the full spectrum of the data input signal 205. This typically requires very high sampling rates of four to eight times the full signal bandwidth. Particularly in broadband contexts, such approaches tend to be costly and difficult to support by practical digital-to-analog converters (DACs), analog-to-digital converters (ADCs), and/or other components. To the extent that conventional approaches operate on less than the full signal bandwidth, they neglect out-of-band or cross-band non-linear distortions, resulting in inefficiencies.

Embodiments described herein provide a novel type of pre-distorter 230 that uses multi-band DPD, or mDPD. In such embodiments, the modulated and encoded signal output by the encoder/modulator 220, referred to herein as wide-band (WB) input signal 225, is segmented into multiple sub-band (SB) input signals, each having a respective bandwidth that is smaller than a bandwidth of the WB input signal. The pre-distorter 230 includes multiple DPD blocks acting in parallel on the SB input signals to generate corresponding pre-distorted SB signals. Each of the pre-distorted SB signals is pre-compensated both for a respective estimated in-band distortion and for a respective estimated cross-band distortion derived from a model of non-linear characteristics of the HPA 250. The pre-distorted SB signals are then combined into a pre-distorted output signal 235, which can be passed to the HPA 250 (e.g., via the upconverter 240) to generate an amplified uplink signal 255. Embodiments are described in more detail below.

The amplified uplink signal 255 can be transmitted over the satellite uplink via the satellite antenna 130/170. Some implementations may include additional components (not shown), such as a polarizer, diplexer, etc. The satellite antenna 130/170 can also receive a downlink signal 265 via a satellite downlink and can direct the downlink signal 265 (e.g., via one or more other components, not shown) to the LNA 270. The LNA 270 can amplify weak incoming signals from the satellite antenna while introducing minimal noise, thereby boosting the signal strength to compensate for losses in subsequent stages of the receiver. The amplified downlink signal can be passed to the down-converter 280, which can reduce the frequency from the satellite band. Typically for a down-converter 280 in a satellite receiver 260 to be a super-heterodyne type of down-converter 280, which converts from satellite RF band to some intermediate frequency (IF) band, and then from the IF band to a baseband in two stages. Such down-conversion can help to simplify subsequent processing and filtering stages of the receiver 260. The down-converter 280 can include a mixer that mixes the downlink signal (in the satellite RF band) with a local oscillator (LO) frequency to produce the desired IF. Such a down-converter 280 can also include, or be in communication with an IF filter to select and filter the desired frequency band after down-conversion, thereby eliminating unwanted noise and interference from other frequencies and allowing only the desired signal to pass through for further processing. The down-converted (e.g., and filtered) signal can be passed to the decoder/demodulator 290 for further processing to extract data and/or other information carried by the received satellite transmission (i.e., encoded in the downlink signal 265). Such recovery can involve demodulating the signal to recover the transmitted symbols, decoding any error correction codes applied during transmission, etc.

Figure 3:
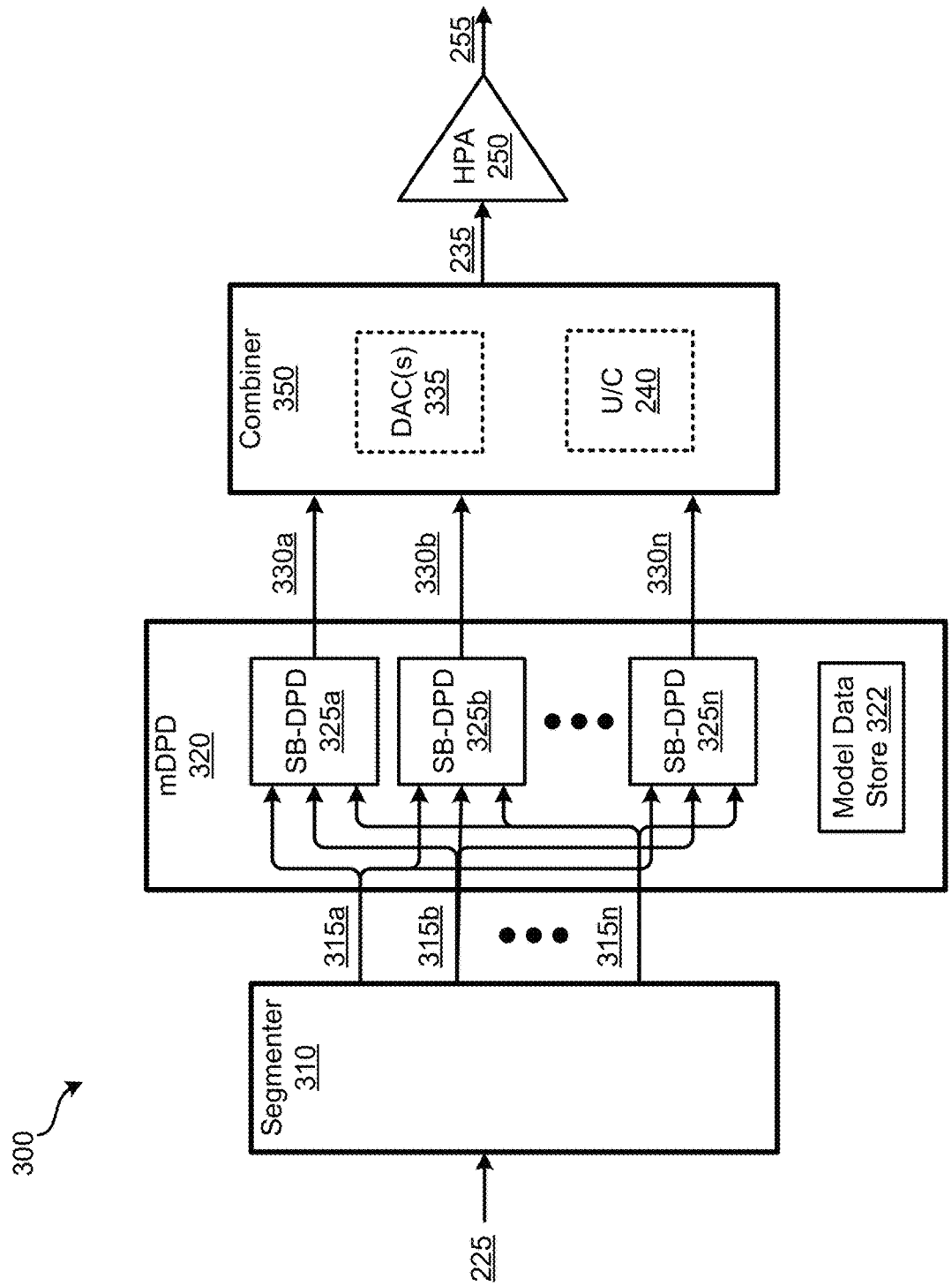
FIG. 3 shows a block diagram of an illustrative portion of a satellite transmitter, according to various embodiments.

FIG. 3 shows a block diagram of an illustrative portion of a satellite transmitter 300, according to various embodiments. The illustrated portion of the satellite transmitter 300 can be an implementation of the pre-distorter 230, upconverter 240, and HPA 250 stages of the transmitter 210 of FIG. 2. As illustrated, the portion of the satellite transmitter 300 can include a segmenter 310, a multi-band digital pre-distorter (mDPD) 320 (also referred to herein as the mDPD processor), a combiner 350, and an HPA 250. Components shown in dashed boxes are optional and/or can be implemented in a different location than the one illustrated.

Embodiments of the segmenter 310 segment a wide-band (WB) input signal 225 into N sub-band (SB) input signals 315. N is a positive integer greater than 1, such that the segmenter 310 generates at least two SB input signals 315. It can be generally assumed that the WB input signal 225 received by the segmenter 310 is a digital signal, and that the output of the segmenter 310 is N digital SB input signals 315. Segmenting of the single WB input signal 225 into N digital SB input signals 315 can be performed in any suitable manner. As described herein, each of the N digital SB signals 315, subsequent to pre-distortion and up-conversion, will correspond to a respective sub-band of a single pre-distorted output signal 235. In some implementations, segmenting of the WB input signal 225 into the N digital SB input signals 315 involves segmenting the data encoded by the WB input signal 225 transmit signal, such that each of the N digital SB signals 315 represents the portion of the data that will ultimately be represented in a respective sub-band of the single pre-distorted output signal 235. In such implementations, each of the N digital SB signals 315 is a baseband signal (e.g., having substantially the same center frequency). The segmenter 310 can be implemented in any transmitter block that is upstream of the mDPD 320, such that the mDPD 320 receives N SB input signals 315. For example, FIG. 2 shows the WB input signal 225 at the input to the pre-distorter block 230, implying that the segmenter 310 is implemented as part of the pre-distorter block 230. Alternatively, the segmenter 310 can be implemented as part of the encoder/modulator 220 of FIG. 2, so that the input to the pre-distorter block 230 is the N SB input signals 315.

The N SB input signals 315 are passed to the mDPD 320. Embodiments of the mDPD 320 are coupled with the segmenter 310 to generate N pre-distorted SB signals 330 from the N SB input signals 315. As described herein, the mDPD 320 pre-compensates each SB input signal 315 both for a respective estimated in-band distortion and for a respective estimated cross-band distortion. Each respective estimated in-band distortion and each respective estimated cross-band distortion is derived from a model of non-linear characteristics of the HPA 250, which can be stored in a model data store 322. The model data store 322 can be part of the mDPD 320 or accessible to the mDPD 320. The model data store 322 can include any suitable type of fast-access memory. The model can be stored in the model data store 322 in any suitable manner. For example, the model can be stored as a set of coefficients.

As illustrated, the mDPD 320 includes N sub-band digital pre-distorters (SB-DPDs) 325. Each SB-DPD 325 is associated with one of the N sub-bands and with a respective set of pre-compensation factors derived from the model (e.g., associated weighting factors, coefficients, etc.) relating to the non-linear distortion of the HPA 250 manifest in that sub-band. In particular, each SB-DPD 325 applies its respective set of pre-compensation factors to all of the N SB input signals 315 to generate its respective pre-distorted SB signal 330. Each of the N pre-distorted SB signals 330 is pre-distorted by the respective SB-DPD 325 in such a way that, when the N pre-distorted SB signals 330 are combined, they will produce a combined signal that has been pre-compensated both for its in-band distortion and for cross-band distortions due to interactions between the sub-bands.

The N pre-distorted SB signals 330 can be passed to the combiner 350. Embodiments of the combiner 350 are coupled with the mDPD 320 to generate a pre-distorted output signal 235 based on up-converting and combining the N pre-distorted SB signals 330. In some embodiments, the combiner 350 includes N digital-to-analog converters (DACs) 335 to generate analog versions of the N pre-distorted SB signals 330 prior to combining the N analog signals into a single pre-distorted output signal 235. In other embodiments, the combiner 350 generates a combined digital signal, and has a single DAC 335 to convert the combined digital signal into the pre-distorted output signal 235.

In some implementations, the combiner 350 effectively sums the N pre-distorted SB signals 330 in the frequency domain to generate the pre-distorted output signal 235 as one wide-band signal. In some implementations, the pre-distorted output signal 235 has the same bandwidth as that of the WB input signal 225. In some embodiments, the combiner 350 includes an upconverter (U/C) 240 to increase the frequency to the desired satellite RF band. In some embodiments, the upconverter 240 is implemented after the combining; the N pre-distorted SB signals 330 are combined into a combined pre-distorted signal at baseband, and the combined pre-distorted signal is upconverted by the upconverter 240 to the satellite RF band as the pre-distorted output signal 235. In other embodiments, the upconverter 240 is implemented prior to the combining; each of the N pre-distorted SB signals 330 is up-converted by the upconverter 240 to the satellite RF band, and the N up-converted signals are combined to form the pre-distorted output signal 235.

The mDPD 320 can be considered as operating on multiple baseband digital complex-valued input signals (N SB input signals 315) $x_m[n]$; m=1, 2, ..., $M_B$, that are not necessarily time-aligned. The variable $M_B$ is also referred to as 'N' herein. The input signals, $x_m[n]$, represent $M_B$ frequency bands of a broadband communications signal whose frequency bands can be contiguous or separated in their carrier frequencies. As noted above, $M_B$ SB-DPDs 325 each generate a corresponding one of $M_B$ pre-distorted SB signals 330, $y_m[n]$; m=1, 2, ..., $M_B$. To remedy harmful non-linear interaction amongst the sub-bands, each SB-DPD 325 takes inputs from all the sub-bands (i.e., each SB-DPD 325 takes all $M_B$ pre-distorted SB signals 330 as inputs). The input-output relationship of the mDPD 320, as processed at multiple samples-per-symbol, can be mathematically expressed as Equation (1):

$$y_{m_d}[n] = \sum_{l=0}^{L} w_{m_d,l,1}^{(1)} \cdot x_{m_d}[n-l] + \sum_{[m_1 m_2 m_3]} x_{m_d,IMD}^{(3)}[n;[m_1 m_2 m_3]] + \sum_{[m_1 m_2 m_3 m_4 m_5]} x_{m_d,IMD}^{(5)}[n;[m_1 m_2 m_3 m_4 m_5]] + \ldots$$

In the above expression, $x_{m_d,IMD}^{(3)}[n; [m_1 m_2 m_3]]$ represents the 3rd-order non-linear inter-modulation distortion (IMD) resulting from sub-band combination $[m_1 m_2 m_3]$, expressed as Equation (2):

$$x_{m_d,IMD}^{(3)}[n;[m_1 m_2 m_3]] = \sum_{l=0}^{L} w_{m_d,l,m}^{(3)} \cdot x_{m_1}[n-l] \cdot x_{m_2}[n-l] \cdot x_{m_3}^*[n-l],$$

and $x_{m_d,IMD}^{(5)}[n; [m_1 m_2 m_3 m_4 m_5]]$ represents the 5th-order non-linear IMD resulting from sub-band combination $[m_1 m_2 m_3 m_4 m_5]$, expressed as Equation (3):

$$x_{m_d,IMD}^{(5)}[n;[m_1 m_2 m_3 m_4 m_5]] = \sum_{l=0}^{L} w_{m_d,l,m}^{(5)} \cdot x_{m_1}[n-l] \cdot x_{m_2}[n-l] \cdot x_{m_3}[n-l] \cdot x_{m_4}^*[n-l] \cdot x_{m_5}^*[n-l],$$

where $m_1, m_2, m_3, m_4, m_5 \in \{1, 2, \ldots, M_B\}$. Also, in the above expressions, the parameter L is the memory depth and $w_{m_d,l,m}^{(o)}$ m is the set of $m_d$th digital pre-distorter coefficients associated with the oth-order nonlinearity, lth sample delay, and mth sub-band combination.

The non-linear expressions above are based on a reduced-complexity Volterra model that can provide an accurate representation of non-linear systems with memory. In particular, they provide a generalization of the memory polynomial model that accounts for the intermodulation distortion across multiple bands. Other non-linear representations can also be used such as orthogonal polynomials for basis functions. Also, these expressions are shown for up to the 5th-order non-linearity order but can be expanded in a similar fashion to account for higher orders of the non-linearity, such as 7th-order, if desired. In addition, these expressions can be modified to handle the case of input signals, $x_m[n]$, that are not time-aligned.

Using stacked construction, the mDPD 320 expressed above can be equivalently described in a compact matrix-vector form as Equation (4):

$$\underline{y}_{m_d} = X_{m_d} \underline{w}_{m_d}.$$

In Equation (4), $\underline{y}_{m_d}$ is a vector of size $N_{data} \times 1$ resulting from stacking the output of the math digital pre-distorter over a data block of time samples with length $N_{data}$, as expressed in Equation (5):

$$\underline{y}_{m_d} = [y_{m_d}[n], y_{m_d}[n-1], \ldots, y_{m_d}[n+N_{data}-1]]^T.$$

In Equation (4), $\underline{w}_{m_d}$ is a vector of size $N_{data} \times 1$ collecting all of $N_w$ digital pre-distorter coefficients spanning non-linear orders, memory depth, and sub-band combinations with significant contribution to IMD, stacked as expressed in Equation (6):

$$\underline{w}_{m_d} = [w_{m_d,0,1}^{(1)}, w_{m_d,0,1}^{(3)}, w_{m_d,0,2}^{(3)}, \ldots, w_{m_d,0,1}^{(5)},\\ w_{m_d,0,2}^{(5)}, \ldots, w_{m_d,L,1}^{(1)}, w_{m_d,L,1}^{(3)},\\ w_{m_d,L,2}^{(3)}, \ldots, w_{m_d,L,1}^{(5)}, w_{m_d,L,2}^{(5)}, \ldots, ]^T.$$

In Equation (4), the matrix $X_{m_d}$ is of size $N_{data} \times 1$ composed by stacking L+1 matrices associated with the memory depth L as in Equation (7):

$$X_{m_d} = [\Xi_{m_d,0} \Xi_{m_d,1} \ldots \Xi_{m_d,L}].$$

Each individual matrix $\Xi_{m_d,l}$ in Equation (7) has $N_{data}$ rows whose ith row contains the input's non-linear operations spanning non-linear orders, memory depth, and sub-band combinations with significant contribution to IMD, corresponding to Equation (6), as expressed in Equation (8):

$$\Xi_{m_d,l}|_{ith-row} = [x_{m_d}[n-l+(i-1)]x_{m_d,IMD}^{(3)}[n-l+(i-1);\\ [m_1 m_2 m_3]] \ldots x_{m_d,IMD}^{(5)}[n-l+(i-1);\\ [m_1 m_2 m_3 m_4 m_5]]]$$

for l=0, 1, ..., L and i=1, 2, ..., $N_{data}$.

The above matrix-vector form is a preferred formulation for digital pre-distorter coefficient estimation. One method for their evaluation is based on using inverse amplifier modeling by interchanging the input and output signals in Equation (4) and applying the powerful least-square (LS) solution. This can be described mathematically with the setup of Equation (9):

$$\underline{x}_{m_d} = Y_{m_d} \underline{w}_{m_d}.$$

where $Y_{m_d}$ is composed in a similar manner to $X_{m_d}$ of Equation (7) by replacing delayed sample $X_{m_d}[n-1]$ with $Y_{m_d}[n-1]$. The LS solution of the math digital pre-distorter coefficient is expressed as Equation (10):

$$\underline{w}_{m_d} = (Y_{m_d}^H Y_{m_d})^{-1} Y_{m_d}^H \cdot \underline{x}_{m_d}.$$

The performance of mDPD 320 can be further improved by iteratively updating the digital pre-distorter coefficients $\underline{w}_{m_d,j}$ using new data capture, where j is the iteration index. For this, the damped Newton algorithm can be implemented providing an updated set of coefficients $\underline{w}_{m_d,j+1}$ as in Equation (11):

$$\underline{w}_{m_d,j+1} = \underline{w}_{m_d,j} + \mu_j \cdot (Y_{m_d}^H Y_{m_d})^{-1} Y_{m_d}^H \cdot (\underline{x}_{m_d} - Y_{m_d} \underline{w}_{m_d,j}),$$

where $\mu_j$ is a damping sequence selected to adjust speed of convergence versus quality of performance.

As described in context of FIG. 2, the pre-distorted output signal 235 is passed to the HPA 250. Embodiments of the HPA 250 are coupled with the combiner 350 to generate an amplified uplink signal 255 from the pre-distorted output signal 235. Ideally, the non-linear distortion produced by the HPA 250 acts on the pre-distorted output signal 235 so that the resulting amplified uplink signal 255 is a linear signal without distortion.

One feature of the proposed mDPD 320 architecture is its adaptive nature as the digital pre-distorter coefficients are extracted by comparing output to input and applying, for example, least-square solution with iteratively updating the coefficients utilizing new data captures. This way, the formulation can be evaluated without prior knowledge of the non-linearity characteristics and can be rapidly responsive to variations in the environment, including back-off level adjustment and long-term aging effects.

Another feature of the proposed mDPD 320 architecture is its modular structure: only the modules pertaining to sub-band combinations with significant contributions need to be retained. FIGS. 4A and 4B show examples of sub-band combinations $[m_1 m_2 m_3]$ and $[m_1 m_2 m_3 m_4 m_5]$ for the third-order and fifth-order significant non-linear distortion illustrative dual-band ($M_B=2$) and quad-band ($M_B=4$) cases of multi-band digital pre-distortion, respectively. Each row of the tables in FIGS. 4A and 4B represents a separate component (or source) of distortion. For example, in the dual-band case represented by FIG. 4A, looking at third-order effects in sub-band 1, it can be seen that there are two sources of non-linear distortion: the non-linear distortion caused only by sub-band 1 (e.g., carrier 1) on sub-band 1 (i.e., as would be present even in the case of $M_B=1$), and the non-linear distortion caused by a combination of sub-band 1 and sub-band 2 (e.g., carrier 2) on sub-band 1 due to cross-band interactions.

In the illustrated scenario, a choice has been made to compensate for two, higher order, odd-numbered components of the inter-modulation distortion. Other implementations can select more and/or different components to compensate for. Such a selection can be based on various factors. One factor is that selecting a larger number of components requires a larger number of compensations, which can increase the amount of processing resources needed to implement the mDPD. Another factor is that, depending on characteristics of the HPA, certain components may have a more significant contribution to distortion than others. As such, a balance can be found between the amount of processing resources required to implement mDPD and the amount of compensation that can practically be performed.

Figure 5:
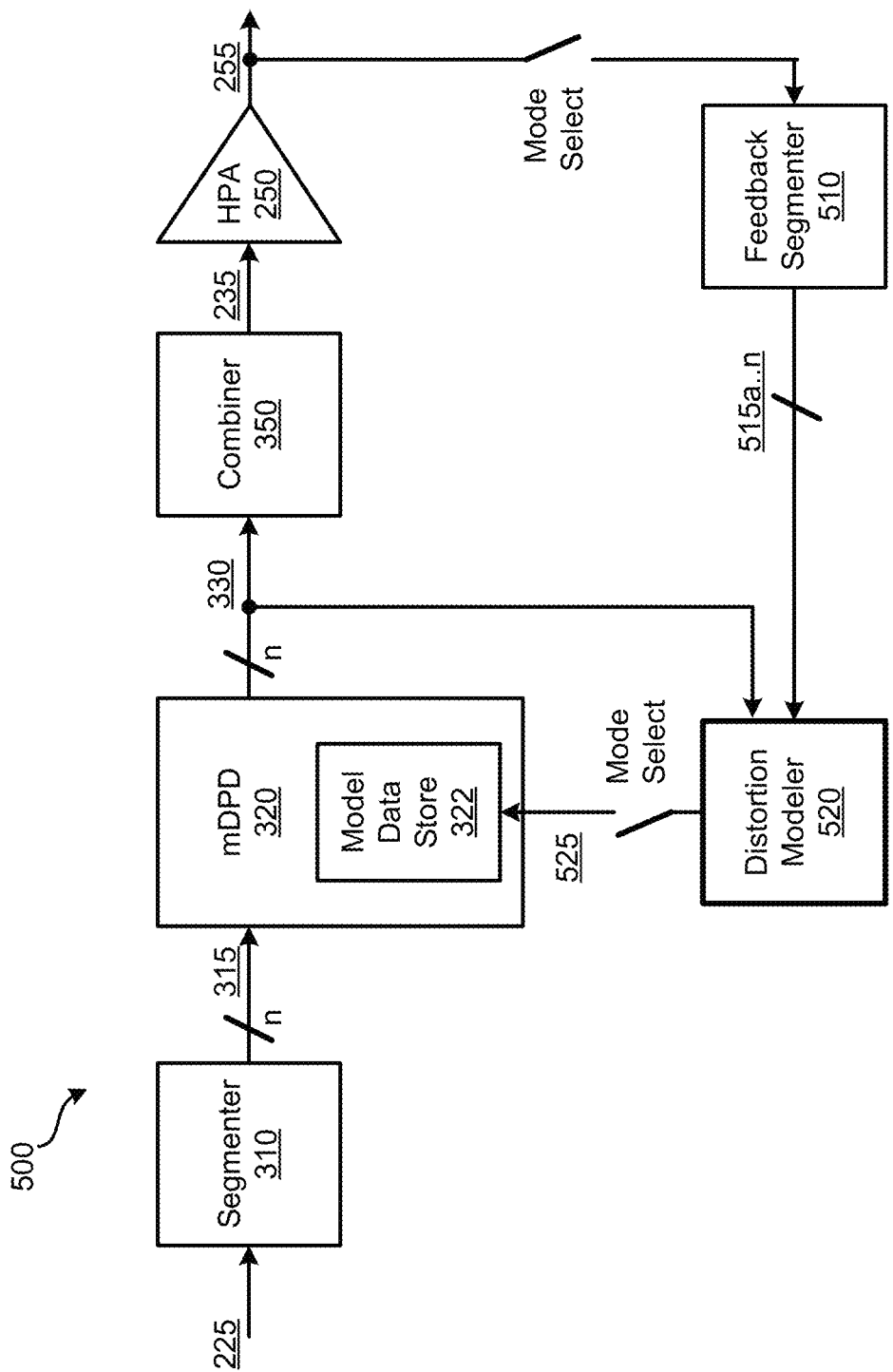
FIG. 5 shows a block diagram of another illustrative portion of a satellite transmitter having a distortion modeler, according to various embodiments.

FIG. 5 shows a block diagram of another illustrative portion of a satellite transmitter 500 having a distortion modeler 520, according to various embodiments. The illustrated portion of the satellite transmitter 500 can be an implementation of the portion of the satellite transmitter 300. As illustrated, the portion of the satellite transmitter 500 can include a segmenter 310, a multi-band digital pre-distorter (mDPD) 320 (also referred to herein as the mDPD processor), a combiner 350, an HPA 250, and a distortion modeler 520.

Embodiments of the distortion modeler 520 are coupled in feedback with the HPA 250 to generate and/or update the model of the non-linear characteristics of the HPA 250 stored in the model data store 322. For example, the model can be a stored representation of significant non-linear distortion contributions across the various sub-bands, such as those represented by FIGS. 4A and 4B. In some embodiments, the distortion modeler 520 selectively operates in an offline mode or an online mode. This is represented in FIG. 5 as a switch, but can be implemented in any suitable manner. In the online mode, the distortion modeler 520 is decoupled from the system (e.g., from receiving feedback from the HPA 250, from providing updates to the model data store 322, etc.). In some embodiments, the mode is selected so that the distortion modeler 520 is set to online mode whenever the satellite transmitter 500 is normally operating to provide satellite communications over a satellite link.

In the offline mode, the distortion modeler 520 is coupled in feedback with the HPA 250. In some embodiments, the offline mode is only used when the satellite transmitter 500 is not otherwise operating, such as in a training, testing, or calibration mode. In other embodiments, the offline mode can be used during normal operation of the satellite transmitter 500, such as for adaptive and/or iteratively updating of the model coefficients. The distortion model of the HPA 250 as stored by the model data store 322 can be updated based on comparing the output of the HPA 250 (the amplified uplink signal 255) with the N pre-distorted SB signals 330 at the output of the mDPD 320. For example, as described above, the distortion modeler 520 can perform inverse modeling of the HPA 250 based on comparing signals representing the output and input of the HPA 250. In some implementations, the distortion modeler 520 takes one or more other upstream signal or signals as inputs, such as the WB input signal 225 at the input to the segmenter 310, or the SB input signals 315 at the input to the mDPD 320. When in offline mode, the distortion modeler 520 outputs a model feedback signal 525 to update the model in the model data store 322.

As described above, updating the model (e.g., the coefficients used by the SB-DPDs 325) can involve additional processing. For example, some embodiments iteratively compute the coefficients by iteratively updating the model, outputting a new set of N pre-distorted SB signals 330 based on the updated model, recomputing the coefficients based on the new set of N pre-distorted SB signals 330, and updating the model again based on the recomputed coefficients. Such an iterative process can involve one or more iterations. In such iterative cases, a first iteration occurs at an initial time (e.g., a first iteration upon first using, first testing, first powering up, etc.) in which the model has not previously been generated. In such cases, initial model parameters (e.g., initial coefficients for the SB-DPDs 325) can be set to any suitable default condition, and the N pre-distorted SB signals 330 can be generated according to those default parameters. In one implementation, simulations, bench testing, or other techniques are used to generate the default set of model parameters, and those default parameters can be stored in the model data store, in a register, in a writable memory device, or in any other suitable manner. In another implementation, the default set of parameters is set so that the SB-DPDs 325 initially only pre-compensate for in-band distortion by effectively giving no weight to inputs from other sub-bands. In another implementation, the default set of parameters is set so that the SB-DPDs 325 initially act effectively as a pass through; the pre-distorted SB signal 330 at the output of each SB-DPD 325 corresponds directly to one of the N SB input signals 315.

In order to facilitate comparison by the distortion modeler 520 of the amplified uplink signal 255 with the SB input signals 315, embodiments include a feedback segmenter 510. Although the feedback segmenter 510 is shown as a separate component, some embodiments implement the feedback segmenter 510 as part of the distortion modeler 520. The feedback segmenter 510 includes circuitry to convert the amplified uplink signal 255 into N SB feedback signals 515 that correspond to the N SB input signals 315. In some embodiments, the feedback segmenter 510 includes a down-converter to convert the amplified uplink signal 255 from the satellite RF frequency down to the baseband frequency range of the SB input signals 315. The feedback segmenter 510 can also include N bandpass filters to generate N sub-band signals from the down-converted signal at corresponding sub-bands to those of the SB input signals 315. The feedback segmenter 510 also includes one or more ADCs, so that the N sub-band signals are output to the distortion modeler 520 as N digital SB feedback signals 515. In one implementation, N sub-band signals are generated in the analog domain and are passed to N ADCs for conversion into the N digital SB feedback signals 515. In another implementation, a single ADC is used to convert the amplified uplink signal 255 to a digital signal prior to segmentation into the N sub-band signals (e.g., using digital BPFs).

As described above, some embodiments compute distortion coefficients based on inverse amplifier modeling (e.g., effectively swapping the input and output) of the HPA 250. Such modeling can be followed by a suitable estimation, such as least squares estimation. For example, coefficients can be computed based on Equations (9)-(11) above. As noted above, the model of the non-linear characteristics of the HPA 250 corresponding to each sub-band can indicate a respective set of multiple distortion components at different orders (i.e., a first-order component; and higher-order components, such as a second-order component, third-order component, fourth-order component, etc.). Accordingly, the respective set of pre-compensation factors for each sub-band as reflected in the mode is computed based on one or more of the higher-order components for the sub-band.

FIGS. 6A-9B show results of computational simulations that demonstrate features of the mDPD approaches described herein, including demonstrating effectiveness of mDPD in minimizing non-linear distortion while operating efficiently. The signal used for evaluation in the simulations is a broadband satellite communications signal that spans 2 GHz of bandwidth, made up of eight 500-MHz carriers. The satellite signal is operated in the V-band (40-75 GHz) of the extremely-high frequency (EHF) range of the electromagnetic spectrum and avoids emissions in the 50.2-50.4 GHz segment to protect the Earth Exploration Satellite Service (EESS). Operating in the EHF band is beneficial in overcoming bandwidth limitations and reducing equipment size. Each carrier applies forward-error correction (FEC) encoding, followed by interleaving, Gray-mapping onto constellations associated with high-order modulation such as amplitude phase shift-keying (APSK), and pulse-shaping by a root-raised cosine (RRC) filter. A single V-band HPA is relied upon for signal amplification which exhibits non-linear characteristics when operated efficiently at close to saturation. Four cases are presented for comparison: no pre-distortion, single-band mDPD (e.g., $M_B=1$), dual-band mDPD (e.g., $M_B=2$), and quad-band mDPD (e.g., $M_B=4$).

Figure 6B:
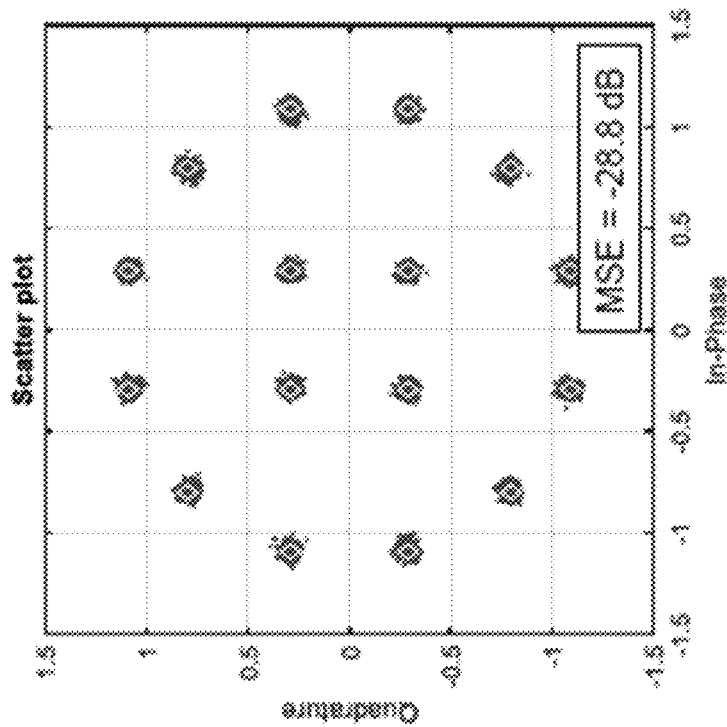
FIGS. 6A and 6B show performance of a transmitter that does not use any pre-distortion in terms of power spectral density (PSD) at the high-power amplifier (HPA) output and mean square error (MSE) at a receive filter for a typical carrier, respectively.
Figure 6A:
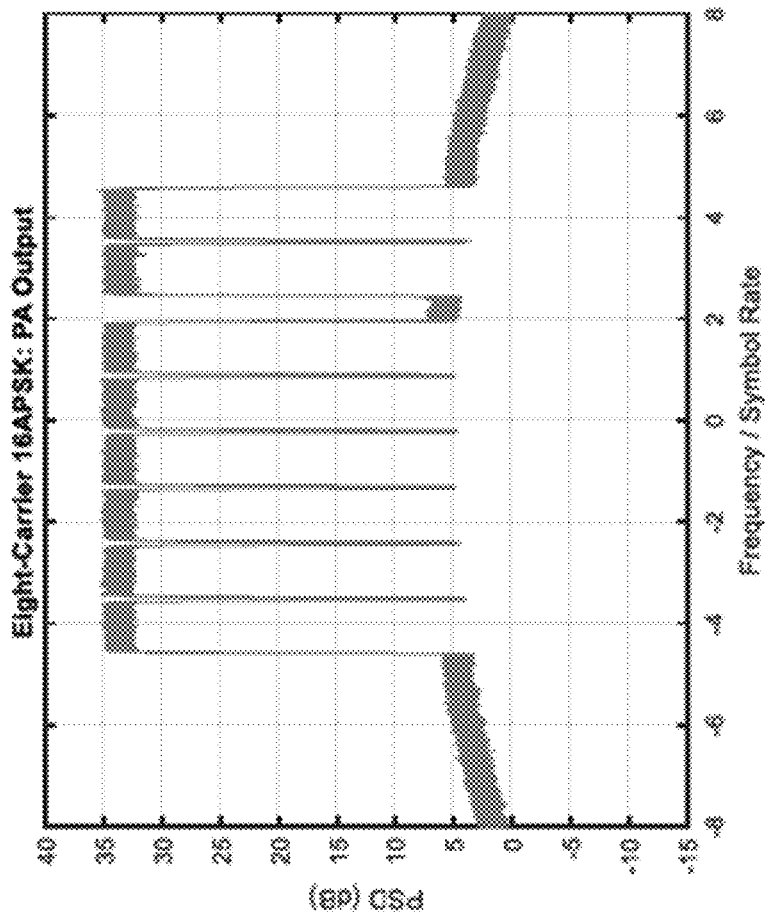

FIGS. 6A and 6B show performance of a transmitter that does not use any pre-distortion in terms of power spectral density (PSD) at the HPA output and mean square error (MSE) at a receive filter for a typical carrier, respectively. The PSD can be a measure of spectral regrowth corresponding to a quantification of out-of-band emission, and the MSE can be a measure of in-band distortion. Both are harmful effects, arising from the non-linear characteristics of the HPA when operated efficiently, and it is desirable to reduce both effects. As can be seen in FIGS. 6A and 6B, the HPA creates spectral spreading and in-band distortion that are quite noticeable when no pre-distortion is applied.

Figure 7B:
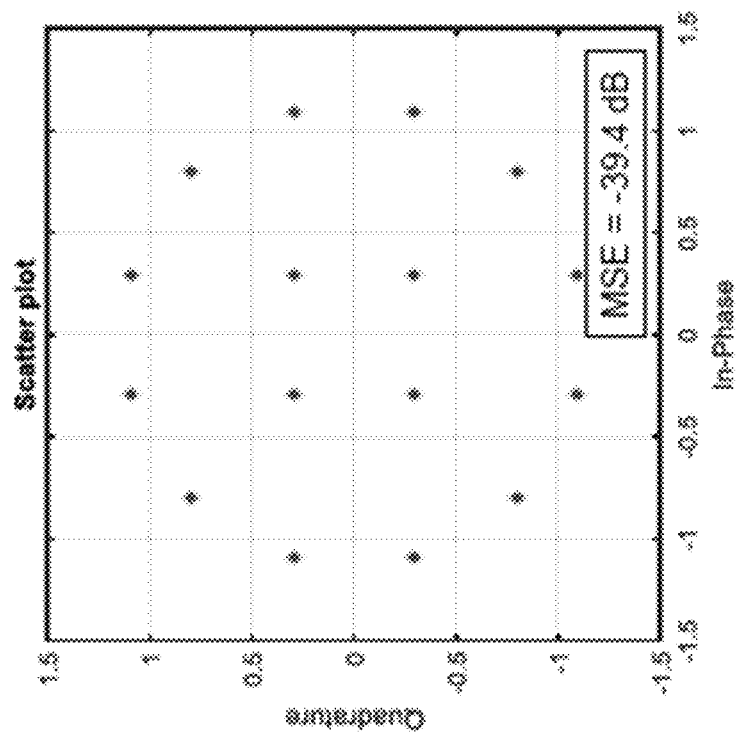
FIGS. 7A and 7B show performance of a transmitter that uses single-band pre-distortion in terms of PSD at the HPA output and MSE at a receive filter for a typical carrier, respectively.
Figure 7A:
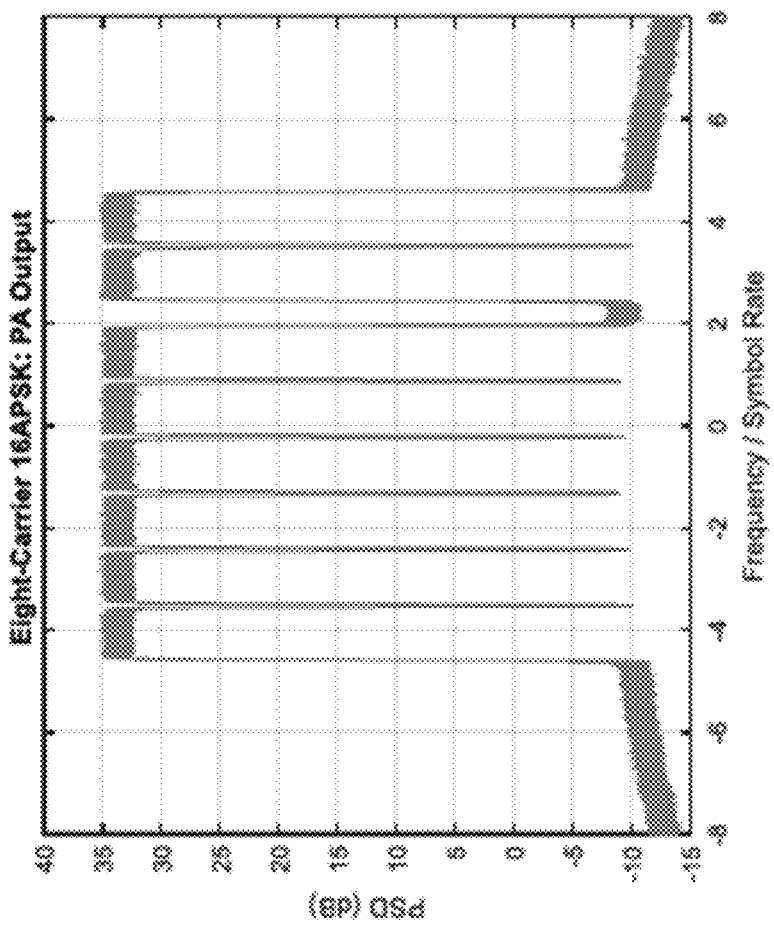

FIGS. 7A and 7B show performance of a transmitter that uses single-band pre-distortion in terms of PSD at the HPA output and MSE at a receive filter for a typical carrier, respectively. Although the single-band case is not truly a case of mDPD (e.g., there is no cross-band distortion when segmenting into a single band), the simulation was performed using the proposed mDPD architectures described herein (e.g., as described with reference to FIGS. 3 and 5) with only a single SB input signal, a single SB-DPD, a single pre-distorted SB signal, etc. In comparison to FIGS. 6A and 6B, it can be seen that using a single-band version of the proposed mDPD architecture can reduce spectral spreading by about 15 dB and can reduce in-band distortion by about 10 dB (at the same output power).

Figure 8B:
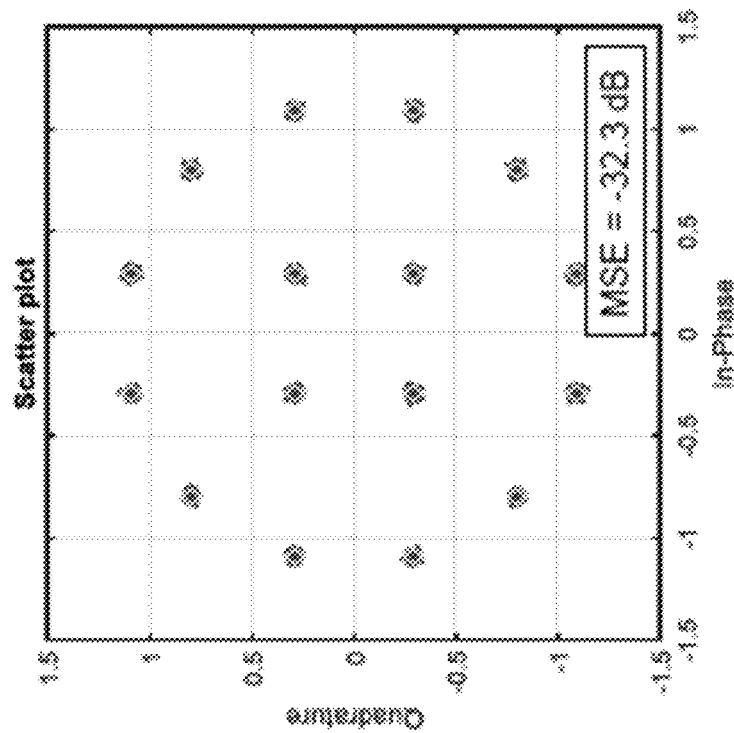
FIGS. 8A and 8B show performance of a transmitter that uses dual-band mDPD in terms of PSD at the HPA output and MSE at a receive filter for a typical carrier, respectively.
Figure 8A:
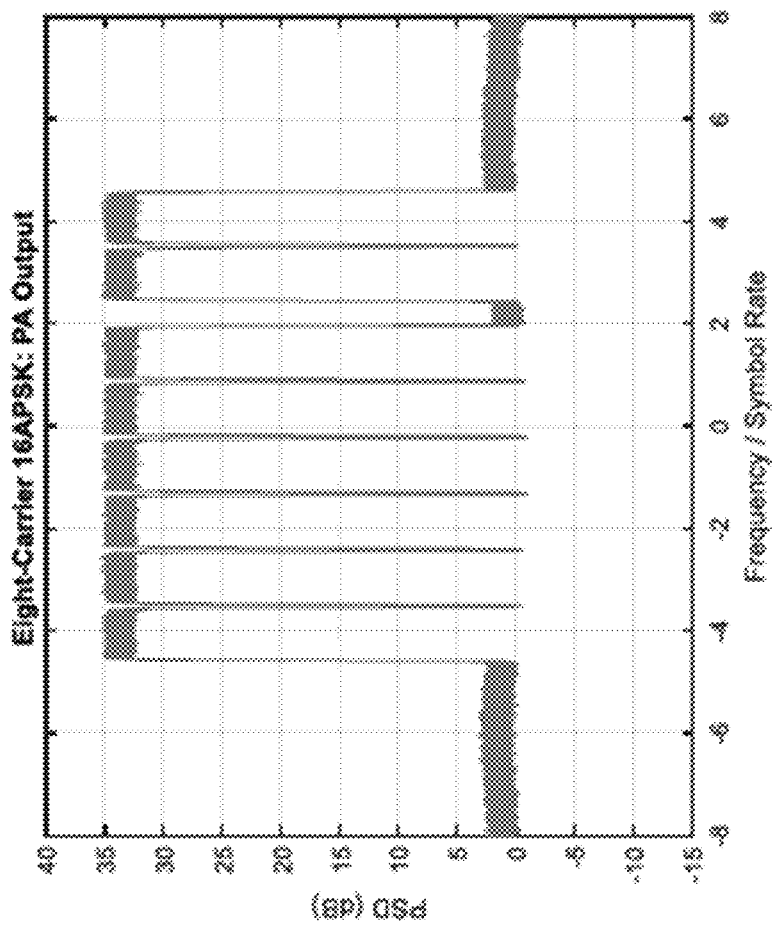
Figure 9B:
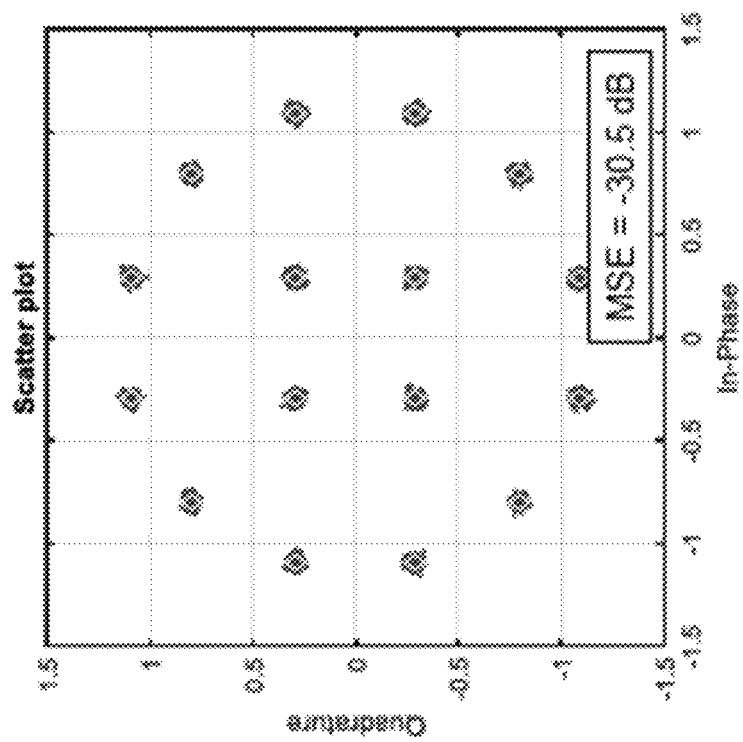
FIGS. 9A and 9B show performance of a transmitter that uses quad-band mDPD in terms of PSD at the HPA output and MSE at a receive filter for a typical carrier, respectively.
Figure 9A:
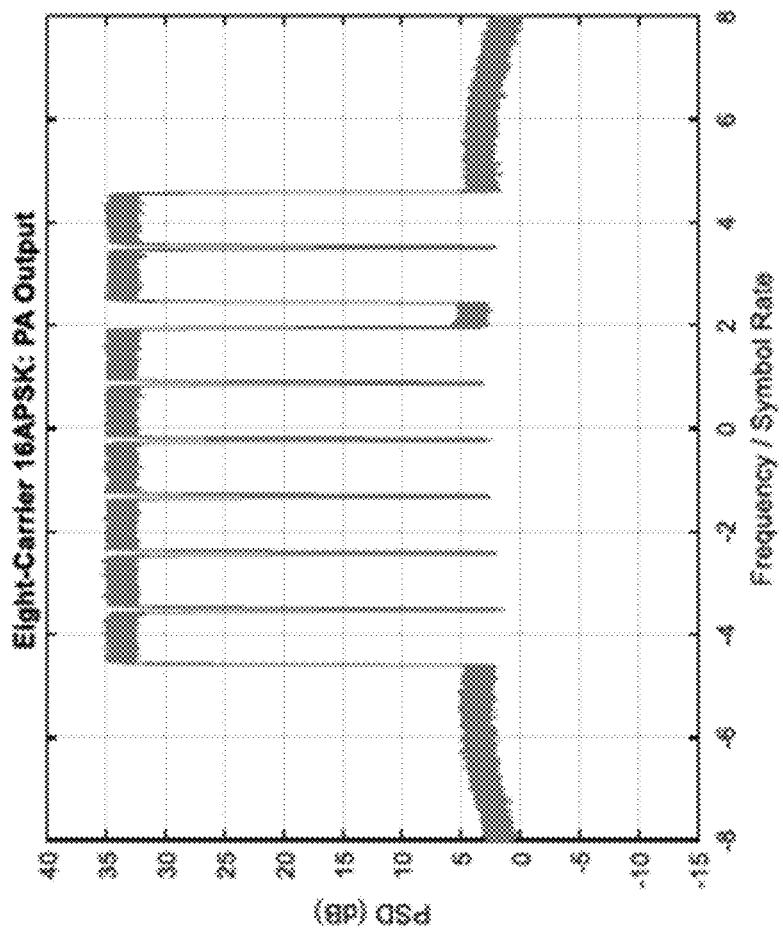

FIGS. 8A and 8B show performance of a transmitter that uses dual-band mDPD (e.g., $M_B=2$) in terms of PSD at the HPA output and MSE at a receive filter for a typical carrier, respectively. FIGS. 9A and 9B show performance of a transmitter that uses quad-band mDPD (e.g., $M_B=4$) in terms of PSD at the HPA output and MSE at a receive filter for a typical carrier, respectively. In both cases (also in the single-band case of FIGS. 7A and 7B), the digital pre-distortion coefficients are extracted using damped Newton algorithm (e.g., as in Equation (11) above) with three iterations of data capture. Also, to compensate for non-linear interactions amongst the frequency bands in the dual-band and quad-band cases, the sub-band combinations in Equation (1) consider the interactions listed in FIGS. 4A and 4B as those manifesting significant non-linear contributions. In those cases, the tables in FIGS. 4A and 4B correspond to the case of eight contiguous carriers except for a frequency gap to avoid an EESS segment prior to the seventh carrier. It can be seen in FIGS. 8A and 8B that, in comparison to FIGS. 6A and 6B, for the same output power, there is a reduction of about 5 dB at the edge of the spectrum and of about 3.5 dB in in-band distortion. Similar performance enhancements can be seen for the quad-band case of FIGS. 9A and 9B, even when applied for tightly packed frequency segments as considered in the simulation setup.

Although the results show that increased segmentation into larger numbers of sub-bands can lessen performance enhancement effects, such segmentation appreciably reduces sampling rate requirements for ADCs, DACs, and/or other components. For example, the minimum sampling rate requirement, relative to a single SB-DPD, can be reduced by a factor of two in the dual-band case and by a factor of four in the quad-band case. Such benefits can be further enhanced in cases where input band segments are separated by a large amount in frequency.

Figure 10A:
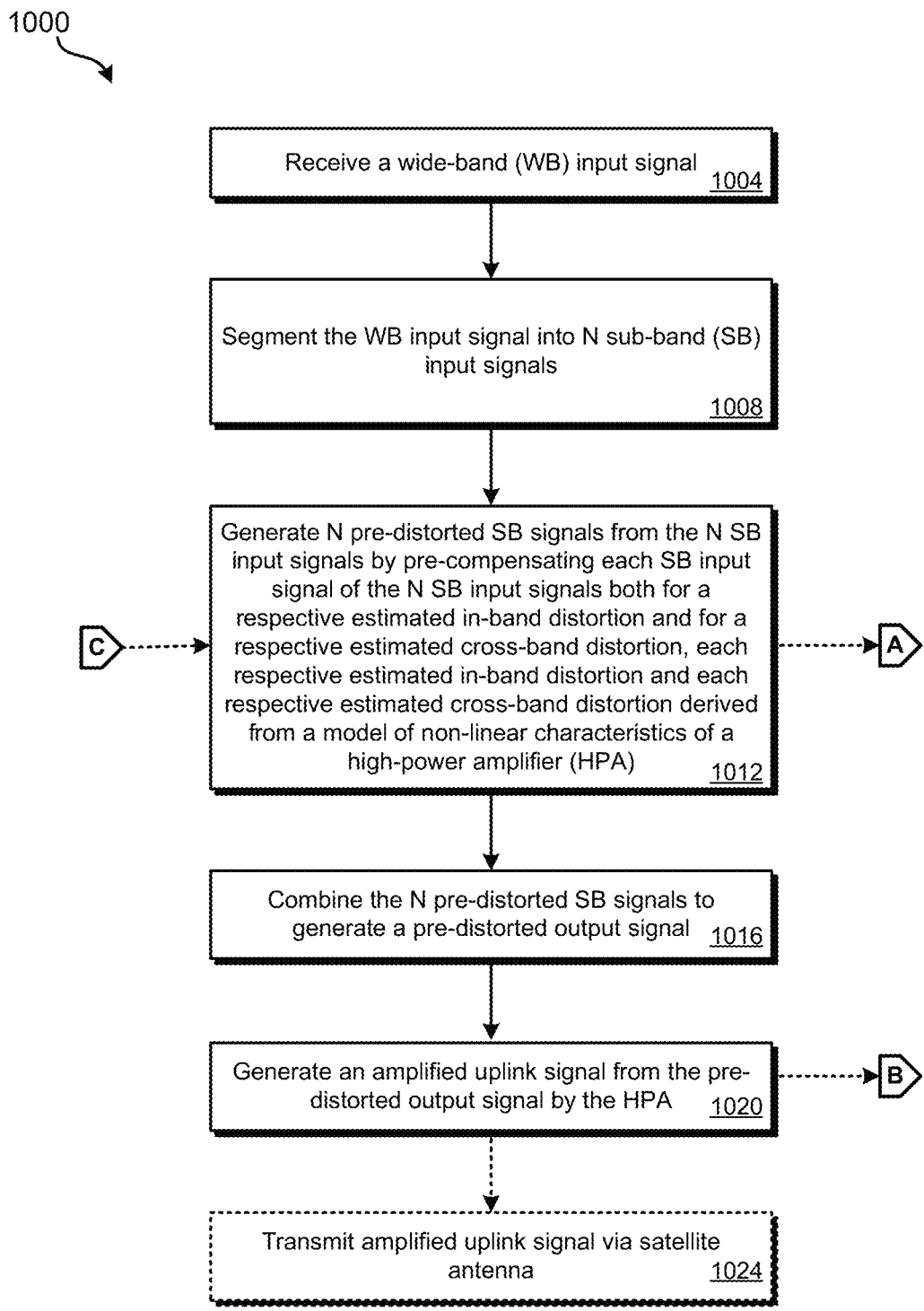
FIG. 10A shows a flow diagram of an illustrative method for mDPD in a transmitter, according to embodiments described herein.

FIG. 10A shows a flow diagram of an illustrative method 1000 for multi-band pre-distortion (mDPD) in a transmitter, according to embodiments described herein. Embodiments of the method 1000 can be performed using any of the mDPD architectures described herein, and/or variations thereof. Embodiments of the method 1000 begin at stage 1004 by receiving a wide-band (WB) input signal. At stage 1008, embodiments segment the WB input signal into N sub-band (SB) input signals. N is a positive integer greater than 1. As described above, the segmenting at stage 1008 can involve segmenting the data of the WB input signal, such that each SB input signal represents a respective portion of the data associated with a respective sub-band of the signal that will be transmitted by the transmitter.

At stage 1012, embodiments can generate N pre-distorted SB signals from the N SB input signals by pre-compensating each SB input signal of the N SB input signals both for a respective estimated in-band distortion and for a respective estimated cross-band distortion. Each respective estimated in-band distortion and each respective estimated cross-band distortion is derived from a model of non-linear characteristics of a high-power amplifier (HPA). In some embodiments, the generating at stage 1012 includes passing the N SB input signals to N parallel pre-distorters (e.g., SB-DPDs). Each of the N parallel pre-distorters generates a respective one of the N pre-distorted SB signals by applying a respective set of pre-compensation factors to the N SB input signals. Each respective set of pre-compensation factors is computed based on the model of the non-linear characteristics of the HPA. In some such embodiments, the model of the non-linear characteristics of the HPA, at each respective bandwidth, indicates respective distortion components including a first-order component and multiple higher-order components; and the respective set of pre-compensation factors is computed based on at least one of the higher-order components for the respective bandwidth.

At stage 1016, embodiments can combine the N pre-distorted SB signals to generate a pre-distorted output signal. In some embodiments, the combining at stage 1016 includes converting each of the N digital pre-distorted SB signals to a respective one N analog pre-distorted SB signals using N DACs. In some embodiments, the combining at stage 1016 includes up-converting either the N pre-distorted SB signals or the pre-distorted output signal, such that the pre-distorted output signal is a wide-band signal in a satellite radiofrequency band. At stage 1020, embodiments can generate an amplified uplink signal from the pre-distorted output signal by the HPA. In some embodiments, at stage 1024, the amplified uplink signal can be transmitted to a satellite uplink via a satellite antenna.

Figure 10B:
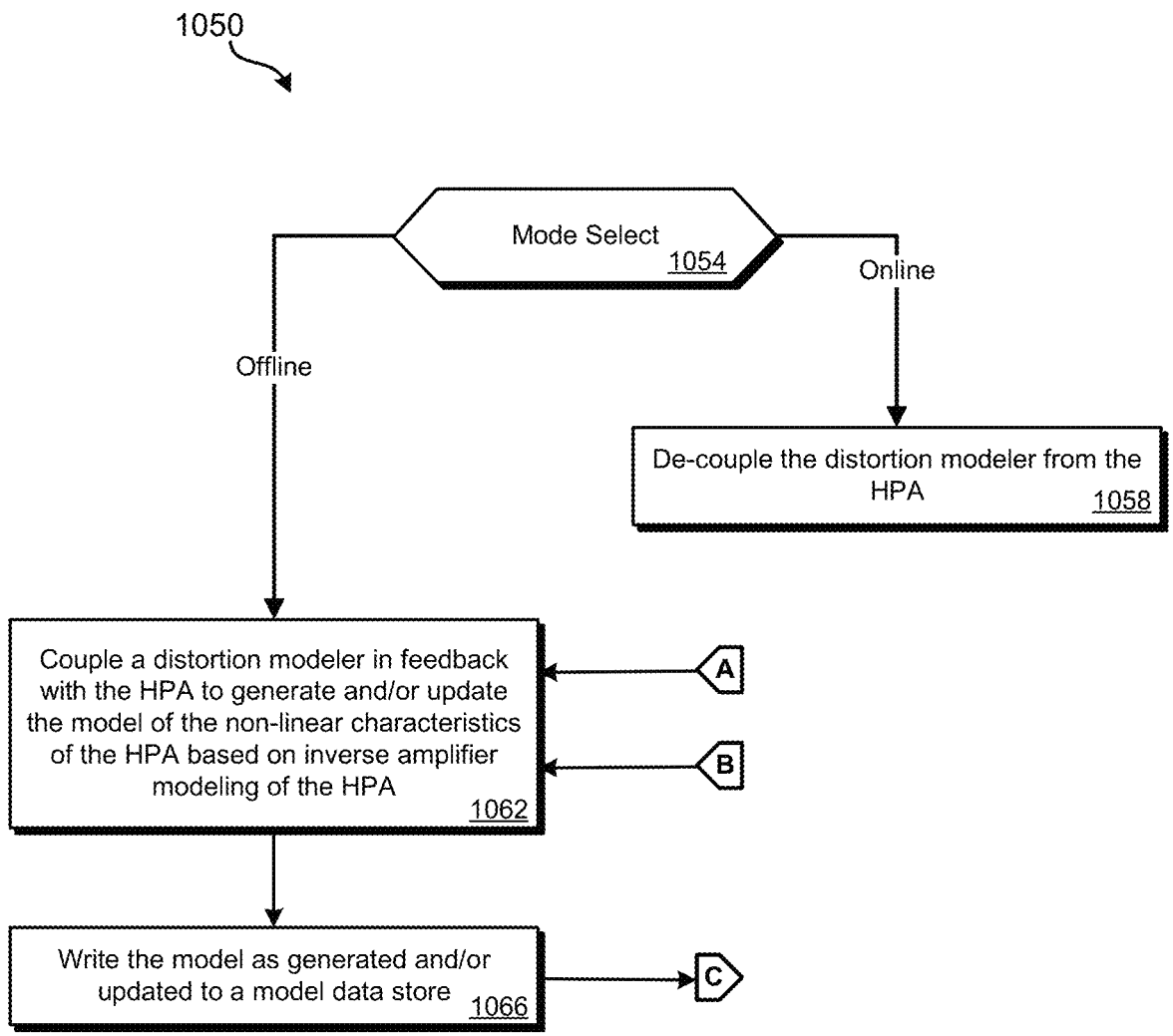
FIG. 10B shows a flow diagram of a method, which can be an optional portion of illustrative method of FIG. 10, according to embodiments described herein.

FIG. 10B shows a flow diagram of a method 1050, which can be an optional portion of illustrative method 1000 of FIG. 10, according to embodiments described herein. Embodiments can begin at stage 1054 by detecting a change of selected mode. Embodiments assume that a distortion modeler is configured to selectively operate in either an offline or an online mode according to the mode selection at stage 1054. If the selected mode is changed to the online mode, at stage 1058, embodiments can de-couple the distortion modeler from the HPA. This is effectively an open-loop (non-adaptive) mode of operation whereby mDPD is performed (e.g., at stage 1012 of FIG. 10A) with a static model of non-linear distortion at the HPA.

If the selected mode is changed at stage 1054 to the offline mode, at stage 1062, embodiments can couple the distortion modeler in feedback with the HPA to generate and/or update the model of the non-linear characteristics of the HPA. As discussed with reference to FIG. 5, and as indicated by cross-page references A and B in FIGS. 10A and 10B, the generating and/or updating can be based on comparing the amplified uplink signal (reference 'B') with some or all of the N pre-distorted SB signals from stage 1012 of FIG. 10A (reference 'A'). As described herein, such a comparison can involve segmenting the amplified uplink signal into N SB feedback signals each in a sub-band corresponding to a respective one of the N pre-distorted SB input signals; the generating and/or updating of the model at stage 1062 is based on comparing the N SB feedback signals with the N pre-distorted SB input signals.

In some cases, stage 1062 can occur at an initial time (e.g., a first iteration upon first using, first testing, first powering up, etc.) in which the model has not previously been generated. In such cases, initial model parameters (e.g., initial coefficients for the SB-DPDs) can be set to any suitable default condition, and the N pre-distorted SB signals can be generated in stage 1012 according to those default parameters. In one implementation, simulations, bench testing, or other techniques are used to generate the default set of model parameters, and those default parameters can be stored in the model data store, in a register, in a writable memory device, or in any other suitable manner. In another implementation, the default set of parameters is set so that the SB-DPDs initially only pre-compensate for in-band distortion by effectively giving no weight to inputs from other sub-bands. In another implementation, the default set of parameters is set so that the SB-DPDs initially act effectively as a pass through; the pre-distorted SB signal at the output of each SB-DPD corresponds directly to one of the N SB input signals.

At stage 1066, embodiments can write the model, as generated and/or updated in stage 1062, to a model data store. As illustrated by cross-page reference 'C', this writing at stage 1066 can update the model being used to generate the N pre-distorted SB signals in stage 1012 of FIG. 10A. As described above, this can be an iterative process by which the updated model is used to generate new pre-distorted SB signals at stage 1012, and those new pre-distorted SB signals can be used to compute new updates to the model at stage 1062. For example, in each of one or more iterations, the model as previously generated and/or updated (e.g., from the initial performance of stage 1062 for the first iteration, or from the preceding iteration in subsequent iterations) to generate an updated set of N pre-distorted SB signals at stage 1012. An updated amplified uplink signal can be generated based on the updated set of N pre-distorted SB signals by iterating through stages 1016 and 1020. At a next iteration of stage 1062, the updated amplified uplink signal can then be segmented into an updated set of N SB feedback signals, and the model can be re-updated based on comparing the updated set of N SB feedback signals with the updated set of N pre-distorted SB signals. The re-updated model can again be fed back to stage 1012.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A transmitter comprising:
   a high-power amplifier (HPA);
   a segmenter to segment a wide-band (WB) input signal into N sub-band (SB) input signals, wherein N is a positive integer greater than 1;
   a multi-band digital pre-distortion (mDPD) processor coupled with the segmenter to generate N pre-distorted SB signals from the N SB input signals by pre-compensating each SB input signal of the N SB input signals both for a respective estimated in-band distortion and for a respective estimated cross-band distortion, each respective estimated in-band distortion and each respective estimated cross-band distortion derived from a model of non-linear characteristics of the HPA; and
   a combiner coupled with the mDPD processor to generate a pre-distorted output signal based on combining the N pre-distorted SB signals,
   wherein the HPA is coupled with the combiner to generate an amplified uplink signal from the pre-distorted output signal.

2. The transmitter of claim 1, wherein:
   the mDPD processor comprises N parallel pre-distorters, each to generate a respective one of the N pre-distorted SB signals by applying a respective set of pre-compensation factors to the N SB input signals, each respective set of pre-compensation factors computed based on the model of the non-linear characteristics of the HPA.

3. The transmitter of claim 2, wherein, for each of the N SB input signals:
   the model of the non-linear characteristics of the HPA, at the respective bandwidth, indicates a respective plurality of distortion components including a first-order component and a plurality of higher-order components; and
   the respective set of pre-compensation factors is computed based on at least one of the plurality of higher-order components for the respective bandwidth.

4. The transmitter of claim 3, wherein, for each of the N SB input signals:
   the respective set of pre-compensation factors is computed based on at least two of the plurality of higher-order components for the respective bandwidth.

5. The transmitter of claim 1, further comprising:
   a model data store having stored thereon the model of non-linear characteristics of the HPA at each of a plurality of frequency sub-bands,
   wherein each of the N SB input signals represents a portion of data of the WB input signal associated with a corresponding one of the plurality of frequency sub-bands.

6. The transmitter of claim 1, wherein:
   each of the N SB input signals is a baseband signal.

7. The transmitter of claim 1, wherein:
   the combiner comprises an up-converter to up-convert either the N pre-distorted SB signals or the pre-distorted output signal, such that the pre-distorted output signal is a wide-band signal in a satellite radiofrequency band.

8. The transmitter of claim 1, wherein:
   the N SB input signals are a first N digital signals;
   the mDPD processor pre-compensates each of the N SB input signals both for the respective estimated in-band distortion and for the respective estimated cross-band distortion to generate the N pre-distorted SB signals as a second N digital signals;
   the combiner comprises N digital-to-analog converters to convert each of the second N digital signals to N analog signals; and
   the combiner is to generate the pre-distorted output signal based on combining the N analog signals.

9. The transmitter of claim 1, wherein:
   the N SB input signals are a first N digital signals;
   the mDPD processor pre-compensates each of the N SB input signals both for the respective estimated in-band distortion and for the respective estimated cross-band distortion to generate the N pre-distorted SB signals as a second N digital signals; and
   the combiner is to generate the pre-distorted output signal based on combining the second N digital signals to generate a digital combined signal and using a digital-to-analog converter to convert the digital combined signal to the pre-distorted output signal as an analog signal.

10. The transmitter of claim 1, further comprising:
    a distortion modeler coupled in feedback with the HPA to generate and/or update the model of the non-linear characteristics of the HPA based on inverse amplifier modeling of the HPA using at least the amplified uplink signal.

11. The transmitter of claim 10, further comprising:
    a feedback segmenter coupled between an output of the HPA and the distortion modeler to segment the amplified uplink signal into N SB feedback signals each in a sub-band corresponding to a respective one of the N pre-distorted SB signals,
    wherein the distortion modeler is to generate and/or update the model of the non-linear characteristics of the HPA based on comparing the N SB feedback signals with the N pre-distorted SB signals.

12. The transmitter of claim 10, wherein:
    the distortion modeler is configured selectively to operate in an offline mode or an online mode, the distortion modeler coupled in feedback with the HPA in the offline mode and decoupled from the HPA in the online mode.

13. A method for multi-band pre-distortion (mDPD) in a transmitter, the method comprising:
- receiving a wide-band (WB) input signal;
- segmenting the WB input signal into N sub-band (SB) input signals, wherein N is a positive integer greater than 1;
- generating N pre-distorted SB signals from the N SB input signals by pre-compensating each SB input signal of the N SB input signals both for a respective estimated in-band distortion and for a respective estimated cross-band distortion, each respective estimated in-band distortion and each respective estimated cross-band distortion derived from a model of non-linear characteristics of a high-power amplifier (HPA);
- combining the N pre-distorted SB signals to generate a pre-distorted output signal; and
- generating an amplified uplink signal from the pre-distorted output signal by the HPA.

14. The method of claim 13, wherein:
the generating the N pre-distorted SB signals comprises passing the N SB input signals to N parallel pre-distorters, each of the N parallel pre-distorters to generate a respective one of the N pre-distorted SB signals by applying a respective set of pre-compensation factors to the N SB input signals, each respective set of pre-compensation factors computed based on the model of the non-linear characteristics of the HPA.

15. The method of claim 14, wherein, for each of the N SB input signals:
- the model of the non-linear characteristics of the HPA, at the respective bandwidth, indicates a respective plurality of distortion components including a first-order component and a plurality of higher-order components; and
- the respective set of pre-compensation factors is computed based on at least one of the plurality of higher-order components for the respective bandwidth.

16. The method of claim 13, wherein:
the combining comprises up-converting either the N pre-distorted SB signals or the pre-distorted output signal, such that the pre-distorted output signal is a wide-band signal in a satellite radiofrequency band.

17. The method of claim 13, further comprising:
receiving a mode select signal;
- responsive to the mode select signal indicating to switch to an offline mode, coupling a distortion modeler in feedback with the HPA to generate and/or update the model of the non-linear characteristics of the HPA based on inverse amplifier modeling of the HPA using at least the amplified uplink signal; and
- responsive to the mode select signal indicating to switch to an online mode, de-coupling the distortion modeler from the HPA.

18. The method of claim 17, further comprising, in the offline mode:
- segmenting the amplified uplink signal into N SB feedback signals each in a sub-band corresponding to a respective one of the N pre-distorted SB signals,
- wherein the generating and/or updating the model of the non-linear characteristics of the HPA is based on comparing the N SB feedback signals with the N pre-distorted SB signals.

19. The method of claim 18, further comprising, in the offline mode:
- iterating the segmenting the amplified uplink signal and the generating and/or updating the model one or more times, by, in each iteration, using the model as previously generated and/or updated to generate an updated set of N pre-distorted SB signals, generating an updated amplified uplink signal based on the updated set of N pre-distorted SB signals, segmenting the updated amplified uplink signal to generate into an updated set of N SB feedback signals, and re-updating the model of the non-linear characteristics of the HPA based on comparing the updated set of N SB feedback signals with the updated set of N pre-distorted SB signals.

20. The method of claim 17, further comprising, responsive to the mode select signal indicating to switch to an offline mode:
- writing the model as generated and/or updated to a model data store.

* * * * *